United States Patent
Min et al.

(10) Patent No.: US 11,404,616 B2
(45) Date of Patent: Aug. 2, 2022

(54) MICRO LED DISPLAY MODULE WITH EXCELLENT COLOR TONE AND HIGH BRIGHTNESS

(71) Applicant: SAMSUNG ELECTRONICS CO., LTD., Suwon-si (KR)

(72) Inventors: Sungyong Min, Suwon-si (KR); Byunghoon Lee, Suwon-si (KR); Changjoon Lee, Suwon-si (KR); Kyungwoon Jang, Suwon-si (KR); Changkyu Chung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 38 days.

(21) Appl. No.: 16/914,863

(22) Filed: Jun. 29, 2020

(65) Prior Publication Data

US 2021/0005796 A1    Jan. 7, 2021

(30) Foreign Application Priority Data

Jul. 3, 2019    (KR) ........................ 10-2019-0080039

(51) Int. Cl.
*H01L 33/56*    (2010.01)
*H01L 33/62*    (2010.01)
(Continued)

(52) U.S. Cl.
CPC ............ *H01L 33/56* (2013.01); *H01L 27/153* (2013.01); *H01L 33/0093* (2020.05); *H01L 33/62* (2013.01)

(58) Field of Classification Search
CPC ... H01L 33/56; H01L 27/153; H01L 33/0093; H01L 33/62
See application file for complete search history.

(56) References Cited

U.S. PATENT DOCUMENTS

| 9,917,282 B2 | 3/2018 | Chida |
| 10,135,037 B2 | 11/2018 | Chida |

(Continued)

FOREIGN PATENT DOCUMENTS

| CN | 109449259 A | 3/2019 |
| JP | 2003191521 A | 7/2003 |

(Continued)

OTHER PUBLICATIONS

International Search Report (PCT/ISA/210) and Written Opinion (PCT/ISA/237) dated Oct. 16, 2020 issued by the International Searching Authority in International Application No. PCT/KR2020/008140.

*Primary Examiner* — Jay C Chang
*Assistant Examiner* — Mikka Liu
(74) *Attorney, Agent, or Firm* — Sughrue Mion, PLLC

(57) ABSTRACT

A method of manufacturing a micro light emitting diode (LED) display module. The method of manufacturing a micro LED display module may include: pressing a plurality of micro LEDs disposed on a substrate to which an adhesive layer is applied, to electrically connect the plurality of micro LEDs to electrode pads of the substrate; performing testing to detect whether at least one of the plurality of micro LEDs is defective in a state in which the plurality of micro LEDs are pressurized and the adhesive layer is uncured; and based on detecting that at least one of the plurality of micro LEDs is defective, performing control to harden the adhesive layer.

2 Claims, 20 Drawing Sheets

(51) Int. Cl.
　　　*H01L 27/15*　　　(2006.01)
　　　*H01L 33/00*　　　(2010.01)

(56)　　　　　References Cited

U.S. PATENT DOCUMENTS

| | | |
|---|---|---|
| 10,804,503 B2 | 10/2020 | Chida |
| 2006/0240578 A1 | 10/2006 | Oohata et al. |
| 2017/0033323 A1 | 2/2017 | Chida |
| 2017/0263811 A1 | 9/2017 | Zou et al. |
| 2018/0175332 A1 | 6/2018 | Chida |
| 2018/0261582 A1 | 9/2018 | Henry et al. |
| 2018/0342492 A1 | 11/2018 | Lu |
| 2019/0074485 A1 | 3/2019 | Chida |
| 2019/0157340 A1 | 5/2019 | Liao et al. |
| 2019/0304853 A1* | 10/2019 | Ahn ................. G01R 31/44 |
| 2020/0388795 A1 | 12/2020 | Chida |
| 2020/0411492 A1* | 12/2020 | Ju .................... H01L 33/44 |

FOREIGN PATENT DOCUMENTS

| | | |
|---|---|---|
| JP | 2008-053408 A | 3/2008 |
| KR | 100762707 B1 | 10/2007 |
| KR | 1020120084118 A | 7/2012 |
| KR | 10-2018-0035217 A | 4/2018 |
| KR | 101890934 B1 | 8/2018 |
| KR | 101953645 B1 | 3/2019 |

\* cited by examiner

MICRO LED DISPLAY MODULE WITH EXCELLENT COLOR TONE AND HIGH BRIGHTNESS

CROSS-REFERENCE TO RELATED APPLICATION(S)

This application is based on and claims priority under 35 U.S.C. § 119 to Korean Patent Application No. 10-2019-0080039, filed on Jul. 3, 2019, in the Korean Intellectual Property Office, the disclosure of which is incorporated by reference herein in its entirety.

BACKGROUND

1. Field

The disclosure relates to a display module implementing an improved manufacturing efficiency, and a method of manufacturing the same.

2. Description of the Related Art

A micro light emitting diode (LED), which is a self-emissive inorganic display device, is a self-luminous micro inorganic light emitting element and may refer to an LED having a width, length, and height of 10 to 100 μm. The micro LED may be manufactured in a form of a chip on a wafer, and may be disposed on a target substrate to configure a light emitting module of a display.

That is, a display apparatus using the micro LED may be manufactured by bonding, on a substrate including a thin-film transistor, tens of thousands to tens of millions of micro LEDs at small intervals, and the large number of bonded micro LEDs may implement a display screen with excellent color tones and a high brightness.

Therefore, it is important to manufacture the display apparatus without a defective micro LED among the large number of micro LEDs bonded to the substrate, to implement the display screen with excellent color tones and a high brightness.

Further, a process of removing the defective micro LED among the large number of micro LEDs bonded to the substrate and bonding a new alternative micro LED to the substrate is also important.

SUMMARY

Embodiments of the disclosure overcome the above disadvantages and other disadvantages not described above. Also, the disclosure is not required to overcome the disadvantages described above, and an embodiment of the disclosure may not overcome any of the problems described above.

According to an embodiment, a display module implementing an improved manufacturing efficiency is provided. According to an embodiment, a method of manufacturing the same display module is provided.

According to an embodiment of the disclosure, a method of manufacturing a micro light emitting diode (LED) display module includes: pressurizing a plurality of micro LEDs disposed on a substrate to which an adhesive layer is applied, to electrically connect the plurality of micro LEDs to the substrate; driving the plurality of micro LEDs in a state in which the plurality of micro LEDs are pressurized; checking operation states of the plurality of micro LEDs; and hardening the adhesive layer based on the checked operation states.

In the hardening of the adhesive layer, the adhesive layer may be hardened in a state in which driving power is applied to the plurality of micro LEDs.

The method may further include, after the hardening of the adhesive layer, additionally checking the operation states of the plurality of micro LEDs.

The method may further include repairing a defective micro LED by removing, in case that at least one of the plurality of micro LEDs is defective, the defective micro LED and transferring an alternative micro LED to a position from which the defective micro LED is removed, wherein the hardening of the adhesive layer may be performed after the repairing.

In the hardening of the adhesive layer, the adhesive layer may be hardened in a state in which the plurality of micro LEDs are pressurized.

In the repairing of a defective micro LED, the alternative micro LED may be transferred by using a pick-and-place method.

In the hardening of the adhesive layer, the adhesive layer may be hardened in a state in which the alternative micro LED is pressurized.

According to another embodiment of the disclosure, a method of manufacturing a micro LED display module includes: applying an adhesive layer to a second area of a substrate that is adjacent to a position where a defective micro LED of a plurality of micro LEDs bonded to a first area of the substrate is disposed; transferring an alternative micro LED to the second area to which the adhesive layer is applied; pressurizing the alternative micro LED to electrically connect the alternative micro LED to the substrate; driving the alternative micro LED in a state in which the alternative micro LED is pressurized; checking an operation state of the alternative micro LED; and hardening the adhesive layer based on the checked operation state.

In the hardening of the adhesive layer, the adhesive layer may be hardened in a state in which the alternative micro LED is driven.

The method may further include a repairing a defective micro LED by removing, in case that the alternative micro LED is defective, the defective alternative micro LED and transferring an additional alternative micro LED to a position from which the defective alternative micro LED is removed.

The method may further include, after the applying of the adhesive layer, transporting, from a first space in which the adhesive layer is applied to a second space that is different from the first space, the substrate to which the adhesive layer is applied.

The method may further include, before the transferring the alternative micro LED, arranging the alternative micro LED in a form in which a plurality of electrode pads formed on an upper surface of the substrate face a plurality of connecting pads formed on one surface of the alternative micro LED, respectively.

In the hardening of the adhesive layer, the adhesive layer may be hardened in a state in which the alternative micro LED is pressurized.

In the transferring of the alternative micro LED, the alternative micro LED may be transferred by using a pick-and-place method.

In the transporting of the substrate, a partition for partitioning into the first space and the second space may be opened before transporting the substrate to the second space, and the partition may be closed after transporting the substrate to the second space.

According to another embodiment of the disclosure, a micro LED display module includes: a plurality of micro LEDs each having one surface on which a plurality of connecting pads are formed; and a substrate in which a plurality of thin-film transistors are formed and on which the plurality of micro LEDs are disposed and a plurality of electrode pads connected to each of the plurality of thin-film transistors are formed, wherein the plurality of connecting pads are electrically connected to the plurality of electrode pads, respectively, and a length of a short side of each of the plurality of micro LEDs is shorter than a length of each of the plurality of electrode pads.

The length of the short side of each of the plurality of micro LEDs may be more than two times shorter than the length of each of the plurality of electrode pads.

The length of each of the plurality of electrode pads may be more than two times longer than the length of the short side of each of the plurality of micro LEDs.

The substrate may be divided into a first area and a second area, an alternative micro LED may be disposed in the second area of the substrate that is adjacent to a position where a defective micro LED is disposed in the first area, and the defective micro LED and the alternative micro LED may be bonded to the same plurality of electrode pads.

The plurality of micro LEDs disposed in the first area may include a red micro LED which emits red light, a green micro LED which emits green light, and a blue micro LED which emits blue light, and the red micro LED, the green micro LED, and the blue micro LED may be sequentially arranged on the substrate. According to an embodiment, a method of manufacturing a micro light emitting diode (LED) display module may comprise: pressing a plurality of micro LEDs disposed on a substrate to which an adhesive layer is applied, to electrically connect the plurality of micro LEDs to electrode pads of the substrate; performing testing to detect whether at least one of the plurality of micro LEDs is defective in a state in which the plurality of micro LEDs are pressurized and the adhesive layer is uncured; and based on detecting that at least one of the plurality of micro LEDs is defective, performing control to replace the at least one of the plurality of micro LEDs by removing a defective micro LED and transferring an alternative micro LED to a position from which the defective micro LED was removed, and performing control to harden the adhesive layer.

In the performing of the control to harden the adhesive layer, the adhesive layer may be hardened in a state in which driving power is applied to the plurality of micro LEDs.

After the hardening of the adhesive layer, the method may include performing testing to detect whether the alternative micro LED is defective.

The method may further include, based on detecting that none of the plurality of micro LEDs is defective, performing control to harden the adhesive layer without performing replacement.

The detecting may include: obtaining, from a camera, captured imagery of the plurality of micro LEDs; and recognizing, from the captured imagery, whether the operation states of each of the plurality of micro LEDs is normal.

The repairing of a defective micro LED nay include the alternative micro LED being transferred by using a pick-and-place method.

The controlling to perform the hardening of the adhesive layer may include the adhesive layer is hardened in a state in which the alternative micro LED is pressurized.

According to an embodiment of the disclosure, a micro light emitting diode (LED) display module manufacturing apparatus may include a processor configured to: control a press to press a plurality of micro LEDs disposed on a substrate to which an adhesive layer is applied, to electrically connect the plurality of micro LEDs to electrode pads of the substrate; perform testing to detect whether at least one of the plurality of micro LEDs is defective in a state in which the plurality of micro LEDs are pressurized and the adhesive layer is uncured; and based on detecting that at least one of the plurality of micro LEDs is defective, perform control to replace the at least one of the plurality of micro LEDs by removing a defective micro LED and transferring an alternative micro LED to a position from which the defective micro LED was removed, and perform control to harden the adhesive layer.

The processor may be further configured to: perform the control to harden the adhesive layer in a state in which the alternative micro LED is driven.

The processor may be further configured to: perform testing to detect whether the alternative micro LED is defective.

The processor may be further configured to: after the applying of the adhesive layer, transport, from a first space in which the adhesive layer is applied to a second space that is different from the first space, the substrate to which the adhesive layer is applied.

The processor may be further configured to: before the transferring of the alternative micro LED, arranging the alternative micro LED in a form in which a plurality of electrode pads formed on an upper surface of the substrate face a plurality of connecting pads formed on one surface of the alternative micro LED, respectively.

The processor may be further configured to: perform the detecting by: obtaining, from a camera, captured imagery of the plurality of micro LEDs; and recognizing, from the captured imagery, whether the operation states of each of the plurality of micro LEDs is normal.

The processor may be further configured to: perform transferring of the alternative micro LED by using a pick-and-place method.

The processor may be further configured to: perform control to transport the substrate, by performing control to open a partition for partitioning into the first space and the second space before transporting the substrate to the second space, and closing the partition after transporting the substrate to the second space. Additional and/or other aspects and advantages of the disclosure will be set forth in part in the description which follows and, in part, will be obvious from the description, or may be learned by practice of the disclosure.

BRIEF DESCRIPTION OF THE DRAWINGS

The above and/or other aspects of the disclosure will be more apparent by describing certain embodiments of the disclosure with reference to the accompanying drawings, in which.

DETAILED DESCRIPTION

In order to allow full understanding configurations and effects according to the disclosure, embodiments of the disclosure will be described with reference to the accompanying drawings. The disclosure may, however, be embodied in many different forms and should not be construed as limited to the embodiments set forth herein, and various modifications may be made. It should be understood, however, that the description of the embodiments is provided to enable the disclosure to be complete, and will fully convey the scope of the disclosure to a person having ordinary skill in the art to which the disclosure pertains. In the accompanying drawings, the constituent elements are enlarged in size for convenience of explanation and the proportion of each constituent element may be exaggerated or reduced.

It will be understood that when a constituent element is referred to as being "on" or "connected to" another element, it may be directly connected or directly coupled to another constituent element, or an intervening constituent element may be present therebetween. In contrast, when a constituent element is referred to as being "directly on" or "directly connected to" another constituent element, no intervening constituent element is present therebetween. Other expressions describing relationships between constituent elements such as "between A and B" and "directly between A and B" may be construed similarly.

Terms such as "first" and "second" may be used to describe various constituent elements, but the constituent elements are not to be construed as being limited to the terms. The terms are only used to differentiate one constituent element from another constituent element. For example, the "first" constituent element may be named the "second" constituent element without being departed from the scope of the disclosure and the "second" constituent element may also be similarly named the "first" constituent element.

Singular forms are intended to include plural forms unless the context clearly indicates otherwise. Terms "include" or "have" used in the specification are to specify the presence of stated features, numerals, steps, operations, components, parts, or a combination thereof, and it may be construed that addition of one or more other features, numerals, steps, operations, components, parts, or a combination thereof is possible.

Unless otherwise defined, all terms used in the embodiments of the disclosure have the same meaning as commonly understood by a person having ordinary skills in the art to which the disclosure pertains.

Figure 1:
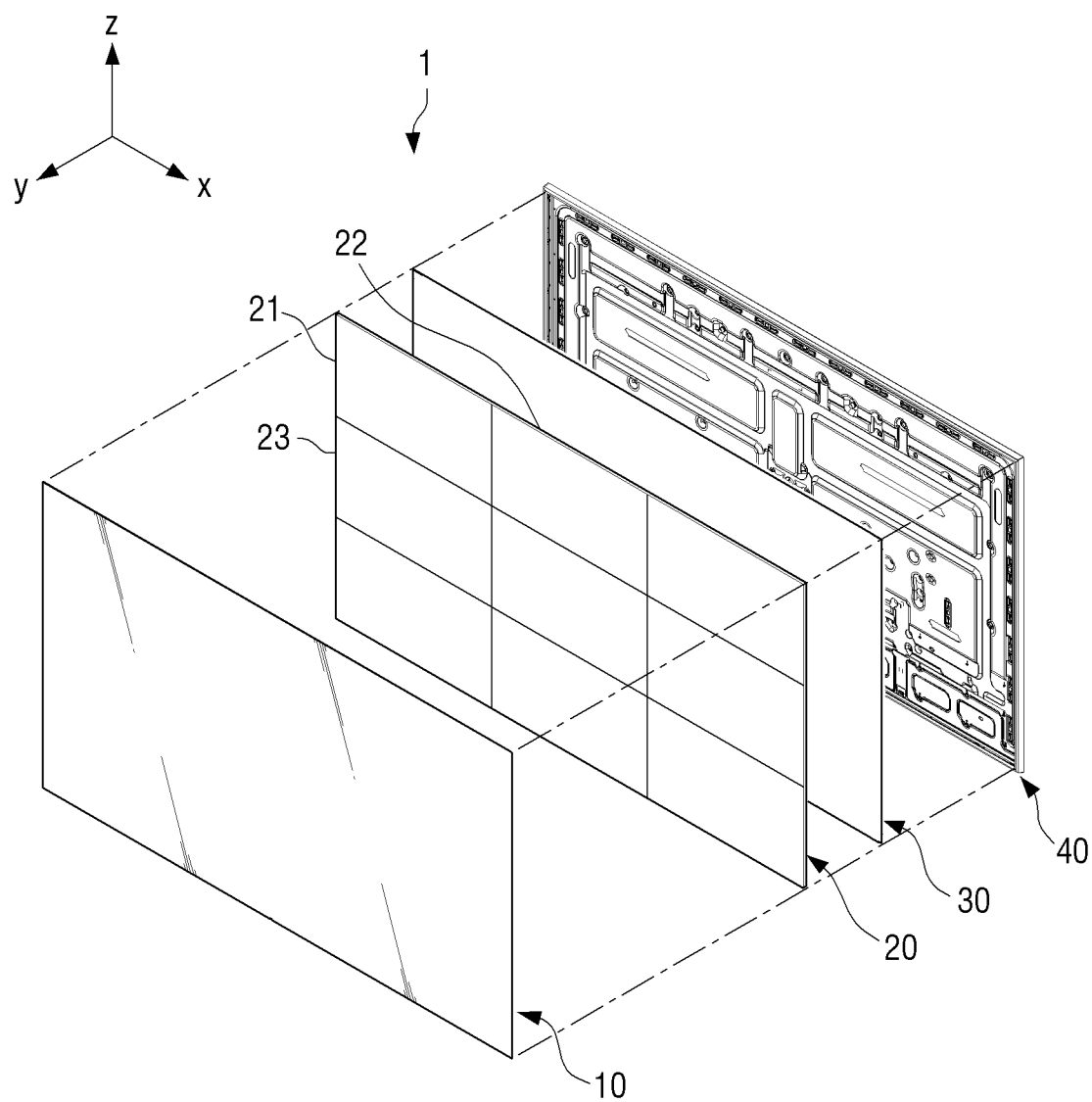
FIG. 1 is an exploded perspective view illustrating a structure of a display apparatus according to an embodiment.

According to an embodiment, a flat display panel may comprise one or more display modules. For example, FIG. 1, shows nine display modules. Each display module may be comprised of multiple micro light emitting diodes (micro LEDs or pLEDs), which each may have a size of 100 µm or less. According to a preferred embodiment, the multiple micro LEDs may each have a size of 30 µm or less. The micro light emitting diodes may be inorganic LEDs. As compared with a liquid crystal display (LCD) panel requiring a backlight, the display module according to an embodiment may offer better contrast, response times, and energy efficiency.

The micro LED according to an embodiment has advantages, such as a rapid response speed, a low power, a high brightness, and a long life, and thus is in the spotlight as a light emitting element of the next generation display. Specifically, the micro LED may convert electricity into photons more efficiently than an existing LCD or an organic light emitting diode (OLED). In other words, a "brightness per watt" of the micro LED may be higher than that of the existing LCD or OLED display. Therefore, the micro LED may have the same brightness with only about a half of the energy consumption, in comparison to the existing LED (a width, a length, and a height thereof each exceeding 100 µm) or OLED. In addition, the micro LED may achieve a high resolution and excellently express color tones, light and shade, and brightness to accurately express color tones in a wide range, thereby making it possible to implement a clear screen even in the outdoors where sunlight is bright. Further, the micro LED is resistant to a burn-in phenomenon and rarely generates heat, and thus has a long life without deformation.

The micro LED according to an embodiment may have a flip chip structure in which an anode and a cathode are both formed on a first surface, and a light emitting surface is formed on a second surface opposite to the first surface on which the anode and the cathode are formed.

One or more display modules, according to an embodiment, may be installed in and applied to a wearable device, a portable device, a handheld device, or various other electronic devices or electric parts requiring a display, as a single unit. Further, a plurality of display modules may be assembled, such as, in a matrix form and applied to a display apparatus, such as, a monitor for a personal computer (PC), a high-resolution television (TV), or digital signage.

Hereinafter, a structure of a display apparatus 1 according to an embodiment will be described with reference to FIG. 1.

FIG. 1 is an exploded perspective view illustrating the structure of the display apparatus 1 according to an embodiment.

The display apparatus 1 may process an image signal received from the outside and visually display an image (e.g., a processed image). The display apparatus 1 may be implemented in various forms, such as, a TV, a monitor, a mobile multimedia apparatus, or a mobile communication apparatus, but the form of the display apparatus 1 is not limited as long as it is configured to visually display an image.

As illustrated in FIG. 1, according to an embodiment, the display apparatus 1 may include a protection member 10, a plurality of micro LED display modules 20, an arrangement member 30, and a housing 40.

According to an embodiment, the protection member 10 may be disposed in the front (Y-axis direction) of the display apparatus 1, and protect the plurality of display modules 20 disposed behind the protection member 10 from the outside.

According to an embodiment, the protection member 10 may be formed of a glass material with a small thickness, and may be formed of various materials as necessary.

According to an embodiment, the plurality of micro LED display modules 20 may implement light to display an image in a front direction (Y-axis direction) according to an image signal input from the outside.

Moreover, the plurality of micro LED display modules 20 may configure a display screen in a manner in which the respective micro LED display modules 20 manufactured as modules are arranged to fit a size of a display to be implemented.

For example, in case that a first micro LED display module 21 and a second micro LED display module 22 are arranged side by side in a horizontal direction (X-axis direction), the display screen may be longer in the horizontal direction (X-axis direction) than in a vertical direction (Z-axis direction) according to an embodiment.

Further, in a case where the first micro LED display module 21 and a third micro LED display module 23 are arranged side by side in the vertical direction (Z-axis direction), the display screen may be longer in the vertical direction (Z-axis direction) than in a horizontal direction (X-axis direction) according to an embodiment.

Therefore, it is possible to implement various sizes and shapes of display screens according to the number of the plurality of arranged micro LED display modules 20 and a form in which the plurality of micro LED display modules 20 are arranged.

A detailed description of the display apparatus 1 and the micro LED display modules 20, according to an embodiment, is provided below with reference to FIG. 1.

According to an embodiment, the arrangement member 30, which is a plate on which the plurality of micro LED display modules 20 may be arranged, may be disposed behind the plurality of micro LED display modules 20.

According to an embodiment, the arrangement member 30 may be formed in a form of a flat plate, and may be formed in various shapes and sizes according to the shape and the size of the plurality of micro LED display modules 20.

According to an embodiment, the arrangement member 30 may support the plurality of micro LED display modules 20 to make the plurality of micro LED display modules 20 be arranged parallel to one another on the same plane (e.g., a same plane on the Z-axis).

Further, with the arrangement member 30, heights of the micro LED display modules 20 may become the same, thereby implementing a uniform brightness of the display screen.

According to an embodiment, the housing 40 may include one or more of the following characteristics: form an appearance of the display apparatus 1, be disposed behind the arrangement member 30, or stably fix the plurality of micro LED display modules 20 and the arrangement member 30.

Further, according to an embodiment, the housing 40 may stably fix an edge region of the protection member 10.

Therefore, the housing 40 may prevent various components included in the display apparatus 1 from being exposed to the outside, and protect the various components included in the display apparatus 1 from an external impact.

Hereinafter, a specific structure and operation of the micro LED display module 20, according to an embodiment, will be described with reference to FIGS. 2 and 3.

Figure 2:
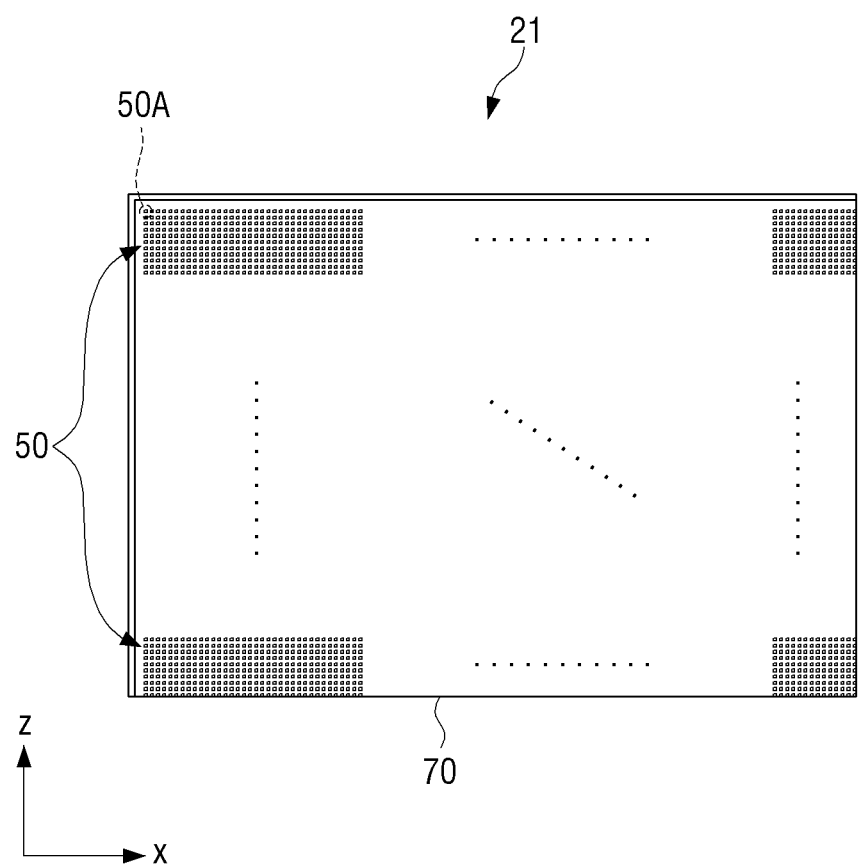
FIG. 2 is a top view illustrating a first micro light emitting diode (LED) display module according to an embodiment.
Figure 3:
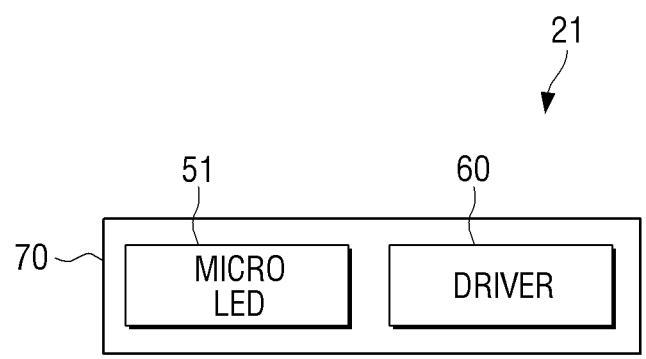
FIG. 3 is a block diagram illustrating a micro LED display module including a micro LED and a driver according to an embodiment.

FIG. 2 is a top view illustrating a first micro LED display module 21 according to an embodiment, and FIG. 3 is a block diagram illustrating a micro LED display module 21 including a micro LED 51 and a driver 60 according to an embodiment.

According to an embodiment, as shown in FIG. 1, the number of micro LED display modules 20 may be more than one, and the plurality of micro LED display modules 20 may have the same structure, such as, the structure of an embodiment according to FIGS. 2 and/or 3. Therefore, the first micro LED display module 21 of FIGS. 1 and/or 3, which may be one of the plurality of micro LED display modules 20 of FIG. 1, is mainly described for convenience of explanation. The other micro LED display modules may have the same structure, a similar structure, or a different structure, according to various embodiments.

According to an embodiment, as shown in FIGS. 2 and 3, the first micro LED display module 21 may include a substrate 70 including a plurality of thin-film transistors 140 (see FIG. 4B), a plurality of pixels 50 arranged in a lattice form on the substrate 70, and the driver 60 driving the plurality of pixels 50.

According to an embodiment, a pixel 50A of the plurality of pixels 50 may refer to a pixel as a minimum unit for various colors. According to an embodiment, the other pixels of the plurality of pixels 50 may have a same structure as pixel 50A. A detailed structure of the pixel 50A will be described with reference to FIGS. 4A and 4B.

According to an embodiment, the substrate 70 may be electrically connected to each of micro LEDs 51 mounted in a matrix form on the substrate 70 to control the micro LEDs 51 through a driving signal of the driver 60.

According to an embodiment, the substrate 70 may be a thin-film transistor (TFT) substrate including a thin-film transistor 140. Further, the substrate 70 may be formed of various materials such as a ductile material, a glass material, or a plastic material, and may include a TFT layer having one surface on which a TFT circuit is formed. Multiple TFT electrodes to which electrodes of the micro LEDs are connected may be provided in the TFT layer, and the TFT layer may have a film form and be attached to one surface of the substrate 70. Further, the substrate 70 may also be referred to as a target substrate.

According to an embodiment, the driver 60 may control the plurality of pixels 50 and the plurality of micro LEDs 51 included in one pixel 50A or more to control a display screen to display.

According to an embodiment, the driver 60 may be connected to the substrate 70 by a Chip on Glass (COG) bonding method or a Film on Glass (FOG) bonding method at an edge region of the substrate 70 or a back surface of the substrate 70.

However, a position of the driver 60 on the substrate 70 and a bonding method are not limited thereto, and may vary.

Further, according to an embodiment, the driver 60 may transfer a gate signal and a source signal to the thin-film transistors included in the substrate 70 to control a brightness and a color of one pixel 50A.

Further, according to an embodiment, the driver 60 may control the plurality of micro LED display modules 20 by using various methods, such as, one or more of: a passive matrix (PM) driving method or an active matrix (AM) driving method.

Hereinafter, structures of the pixel 50A and the micro LED display module 20 according to an embodiment of the disclosure will be described in detail with reference to FIGS. 4A and 4B.

Figure 4A:
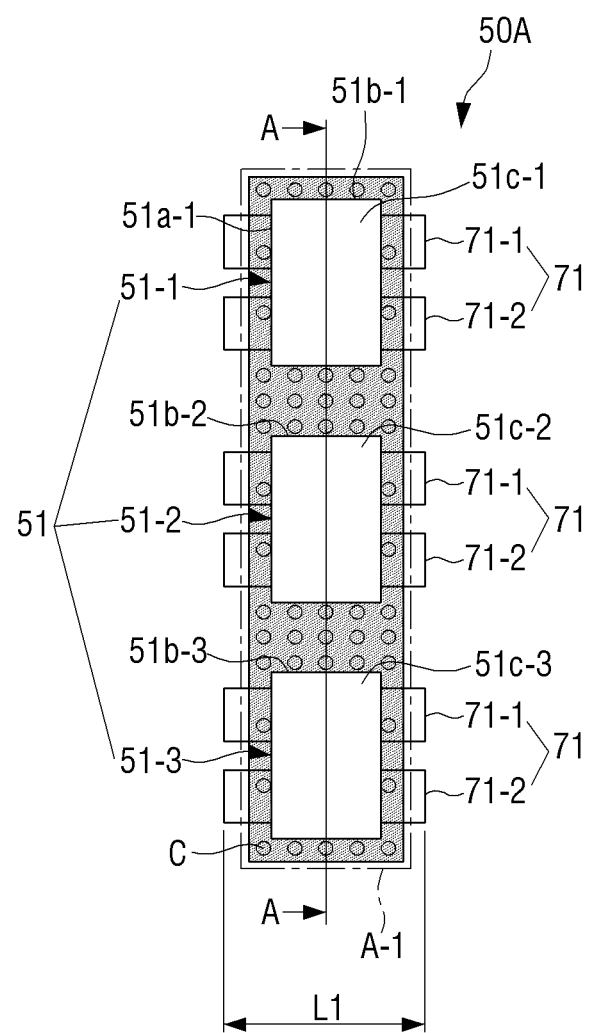
FIG. 4A is a top view illustrating one pixel according to an embodiment.
Figure 4B:
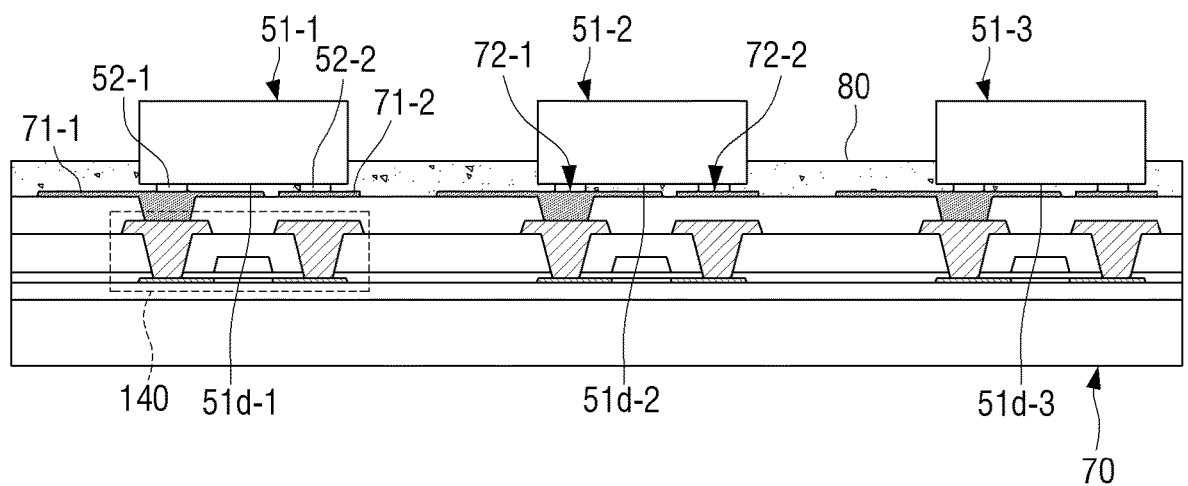
FIG. 4B is a cross-sectional view illustrating one pixel taken along line A-A of FIG. 4A according to an embodiment.

FIG. 4A is a top view illustrating one pixel 50A according to an embodiment of the disclosure, and FIG. 4B is a cross-sectional view of the one pixel 50A taken along line A-A of FIG. 4A.

According to an embodiment, as shown in FIGS. 2, 4A and 4B, the pixels 50 may be arranged at an upper surface of the micro LED display module 20 at a predetermined interval, and each pixel may include the plurality of micro LEDs 51 (e.g., micro LEDs 51-1, 51-2, 51-3).

For example, according to an embodiment, the plurality of micro LEDs 51 included in the pixel 50A may include a red micro LED 51-1 which emits red light, a green micro LED 51-2 which emits green light, and a blue micro LED 51-3 which emits blue light.

According to an embodiment, the micro LED 51 may be formed of an inorganic light emitting material having a width of 100 μm or less, a length of 100 μm or less, and a height of 100 μm or less, and may be disposed on the substrate 70 and emit light by itself. According to an embodiment, the micro LED 51 may be formed of an inorganic light emitting material having one or more of: a width of 100 μm or less, a length of 100 μm or less, or a height of 100 μm or less, and may be disposed on the substrate 70 and emit light by itself.

Further, according to an embodiment, the plurality of micro LEDs 51 may be sequentially arranged on the substrate 70 as illustrated in FIGS. 4A and 4B. For example, according to an embodiment, the red micro LED 51-1, the green micro LED 51-2, and the blue micro LED 51-3 may be sequentially arranged on the substrate 70.

By doing so, the plurality of micro LEDs 51 may implement various colors and brightness as one pixel 50A.

Further, according to an embodiment, each of the plurality of micro LEDs 51 may have a rectangular light emitting surface 51c-1, 51c-2, or 51c-3 having a long side 51a-1, 51a-2, or 51a-3 and a short side 51b-1, 51b-2, or 51b-3 which is shorter than the long side 51a-1, 51a-2, or 51a-3.

According to an embodiment, the micro LED 51 has advantages such as a rapid response speed, a low power, and a high brightness, and thus is in the spotlight as a light emitting element of the next generation display. Specifically, the micro LED 51 converts electricity into photons more efficiently than conventional LEDs.

In other words, a brightness per watt of the micro LED 51 is relatively high compared to conventional LEDs. Therefore, the micro LED 51 may have the same brightness with only about a half of the energy consumption, in comparison to the existing LED or OLED.

In addition, the micro LED 51 may achieve a high resolution and excellently express color tones, light and shape, and brightness to accurately express color tones in a wide range, thereby making it possible to implement a clear screen even in the outdoors where sunlight is bright. Further, the micro LED 51 is resistant to a burn-in phenomenon and rarely generates heat, and thus has a long life without deformation.

Further, according to an embodiment, one or more micro LEDs may be a flip-chip LED.

In addition, according to an embodiment, one or more micro LEDs (e.g., micro LED 51) may include a pair of connecting pads 52-1 and 52-2 as illustrated in FIG. 4B. For example, according to an embodiment, the pair of connecting pads may include a first connecting pad 52-1 and a second connecting pad 52-2 spaced apart from the first connecting pad 52-1.

Further, according to an embodiment, the plurality of connecting pads 52-1 and 52-2 may be formed on one surface (e.g., 51d-1, 51d-2, 51d-3) of the micro LED (e.g., 51-1, 51-2, 51-3). Here, the one surface (e.g., 51d-1, 51d-2, 51d-3) of the micro LED (e.g., 51-1, 51-2, 51-3) may refer to a surface opposite to the light emitting surface (e.g., 51c-1, 51c-2, 51c-3) of the micro LED (e.g., 51-1, 51-2, 51-3).

That is, according to an embodiment, each of the plurality of micro LEDs (e.g., 51-1, 51-2, 51-3) may include the plurality of connecting pads (e.g., 51-1, 52-2) disposed to face one or more respective electrode pads of a plurality of electrode pads (71-1, 71-2, etc.). According to an embodiment, as shown in FIG. 4B, a connecting pad 51-1 may be disposed to face a plurality of electrode pads (71-1, 71-2, etc.).

For example, according to an embodiment, a first electrode pad 71-1 may be disposed to face the first connecting pad 52-1, and a second electrode pad 71-2 may be disposed to face the second connecting pad 52-2.

Further, according to an embodiment, as shown in FIG. 4B, the first connecting pad 52-1 may be electrically connected to the first electrode pad 71-1 of the substrate 70, and the second connecting pad 52-2 may be electrically connected to the second electrode pad 71-2 of the substrate 70.

According to an embodiment, the substrate 70 may include the plurality of electrode pads 71 which a respective one of the plurality of micro LEDs 51 are each disposed above.

Specifically, according to an embodiment, the plurality of micro LEDs 51 may be disposed on the substrate 70, and the substrate 70 may include the plurality of thin-film transistors 140 and the plurality of electrode pads 71 connected to each of the plurality of thin-film transistors 140.

According to an embodiment, the plurality of electrode pads 71 are formed of a conductive material, and may be electrically connected to the plurality of thin-film transistors 140 disposed in the substrate 70.

Further, according to an embodiment, the plurality of electrode pads 71 may be arranged on one surface of the substrate 70 at a predetermined interval.

Further, according to an embodiment, the plurality of electrode pads 71 may be connected to each of the plurality of thin-film transistors 140 formed in the substrate 70. That is, according to an embodiment, a pair of electrode pads 71 may be electrically connected to one thin-film transistor 140.

Therefore, according to an embodiment, the plurality of electrode pads 71 may transfer, to the micro LEDs (51-1, 51-2, 51-3) seated on the plurality of electrode pads 71, respectively, an electric signal transferred from the driver 60 via the plurality of thin-film transistors 140.

Further, according to an embodiment, the plurality of electrode pads 71 may include the first electrode pad 71-1 and the second electrode pad 71-2 spaced apart from each other at a predetermined interval and arranged parallel to each other in the x-axis direction.

Here, according to an embodiment, the first electrode pad 71-1 and the second electrode pad 71-2 may be an anode and a cathode, respectively, configured to drive the micro LED 51-1.

Further, according to an embodiment, the first electrode pad 71-1 and the second electrode pad 71-2 may form a pair, and one pair of electrode pads (e.g., 71-1, 71-2) in the pixel 50A may be spaced apart from another pair of electrode pads (72-1, 72-2).

Therefore, as illustrated in FIGS. 4A and 4B, according to an embodiment, the red micro LED 51-1 may be disposed on a first pair of electrode pads, the green micro LED 51-2 may be disposed on a second pair of electrode pads, and the blue micro LED 51-3 may be disposed on a third pair of electrode pads.

In addition, according to an embodiment, the first electrode pad 71-1 and the second electrode pad 71-2 may have the same length, and the first electrode pad 71-1 and the second electrode pad 71-2 may each have a first length L1 longer than a length of the short side 51*b*-1, 51*b*-2, or 51*b*-3 of one micro LED 51.

For example, according to an embodiment, the length of the short side 51*b* of each of the plurality of micro LEDs 51 may be more than two times shorter than the first length L1 of each of the plurality of electrode pads 71.

That is, according to an embodiment, only one micro LED 51 may be disposed on a pair of electrode pads 71.

According to an embodiment, an adhesive layer 80 may be stacked on the substrate 70 to fix the plurality of micro LEDs 51 to the substrate 70. Specifically, the adhesive layer 80 may be disposed between the plurality of electrode pads 71 formed on the substrate 70 and the plurality of connecting pads 52.

Further, according to an embodiment, the adhesive layer 80 may include a non-conductive material. Therefore, the adhesive layer 80 may be disposed between the plurality of electrode pads 71 and the plurality of connecting pads 52, thereby preventing a short circuit.

Further, according to an embodiment, the adhesive layer 80 may be disposed to surround side surfaces of the plurality of micro LEDs 51, thereby stably fixing the plurality of micro LEDs 51. Here, according to an embodiment, the plurality of micro LEDs 51 may be electrically connected to the substrate 70 through a direct contact of the plurality of electrode pads 71 and the plurality of connecting pads 52. According to an embodiment, the plurality of micro LEDs 51 may be electrically connected to the substrate 70 through a connection (direct or indirect) of the plurality of electrode pads 71 and the plurality of connecting pads 52.

Meanwhile, according to an embodiment, the adhesive layer 80 may be formed of a material in which conductive particles C are disposed in a non-conductive material. According to an embodiment, examples of the adhesive layer 80 may include an anisotropic conductive film (ACF) or anisotropic conductive paste (ACP).

According to an embodiment, the ACF may be an ACF that is formed by mixing fine conductive particles C with an adhesive resin and that conducts electricity only in a single direction.

According to an embodiment, the ACP may be an anisotropic conductive material that is formed by mixing fine conductive particles C with an adhesive resin to maintain adhesiveness and conducts electricity only in a single direction.

Further, the adhesive layer 80 may be formed of a polymer material containing nano-sized or micro-sized conductive particles C.

According to an embodiment, the conductive particles C may be metal particles, such as, one or more of: nickel (Ni) and copper (Cu), carbon particles, solder balls, or polymer balls coated with metal. According to an embodiment, the conductive particles C may be arranged in lines in the non-conductive material, or may be randomly arranged.

As a result, according to an embodiment, the adhesive layer 80 may electrically connect the plurality of connecting pads 52 and the plurality of electrode pads 71 to each other through the conductive particles C.

Figure 6:
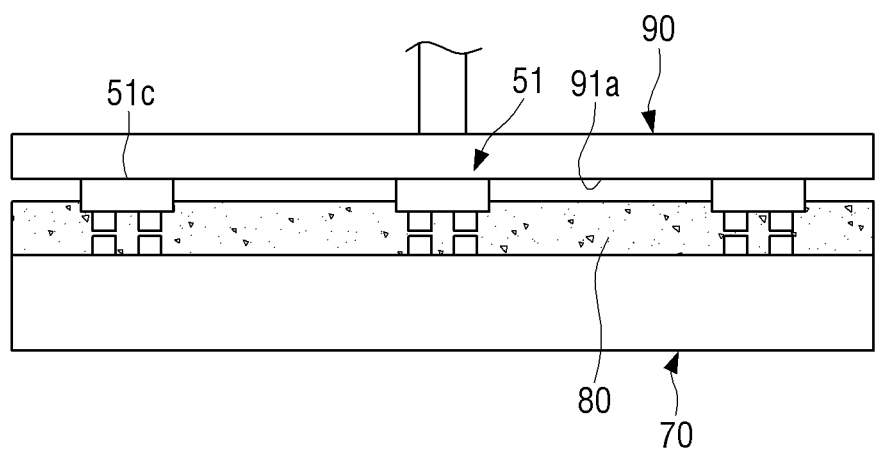
FIG. 6 is a schematic view illustrating a state in which a plurality of micro LEDs are transferred in a structure of FIG. 5 according to an embodiment.

According to an embodiment, the plurality of micro LEDs 51 may be electrically connected to the substrate 70 when the plurality of micro LEDs 51 are pressurized by a pressurizing member 90 (see, e.g., FIG. 6).

For example, according to an embodiment, in a case that the adhesive layer 80 is formed of a non-conductive material and does not include the conductive particles C, the plurality of micro LEDs 51 may be pressurized by the pressurizing member 90, and the plurality of connecting pads 52 and the plurality of electrode pads 71 may directly come into contact with each other, thereby electrically connecting the plurality of micro LEDs 51 to the substrate 70.

Meanwhile, even in a case that the adhesive layer 80 is formed of a non-conductive material and includes the conductive particles C, when the plurality of micro LEDs 51 are pressurized by the pressurizing member 90, the plurality of connecting pads 52 and the plurality of electrode pads 71 may be electrically connected to each other through the conductive particles C.

Hereinafter, a method of manufacturing the micro LED display module according to an embodiment is described in detail with reference to FIGS. 5 to 10.

Figure 5:
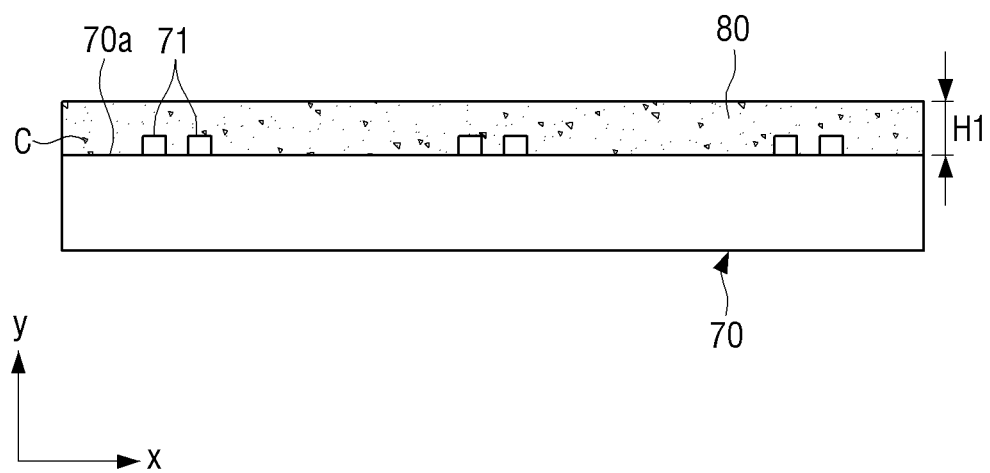
FIG. 5 is a schematic view illustrating a state in which an adhesive layer is applied onto a substrate according to an embodiment.
Figure 7:
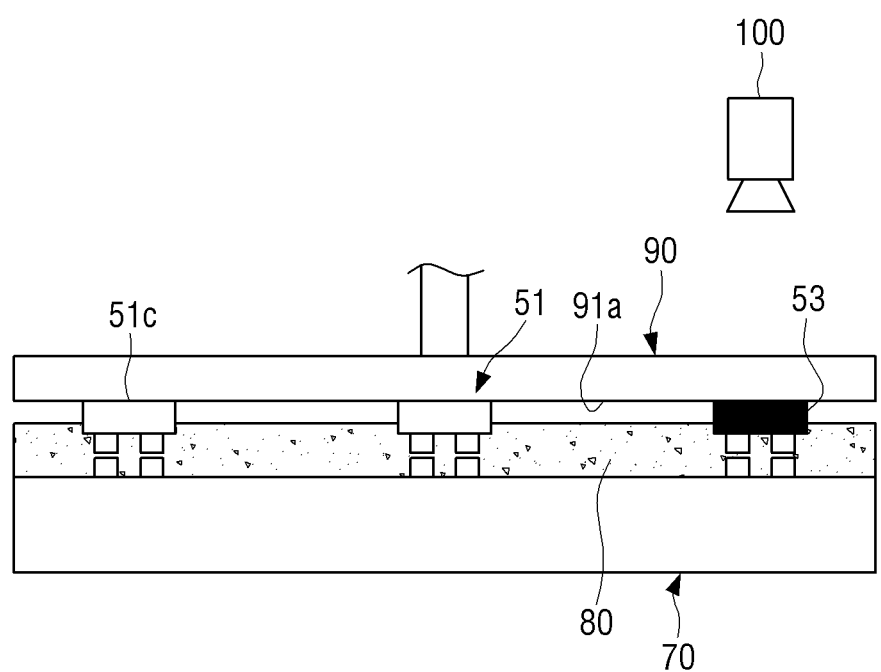
FIG. 7 is a schematic view illustrating a state in which operation states of the plurality of micro LEDs are checked in a structure of FIG. 6 according to an embodiment.
Figure 8:
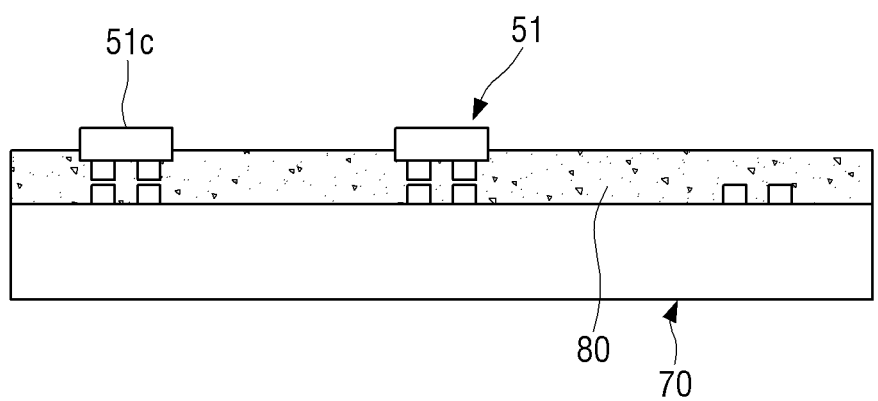
FIG. 8 is a schematic view illustrating a state in which a defective micro LED is removed from a structure of FIG. 7 according to an embodiment.
Figure 9:
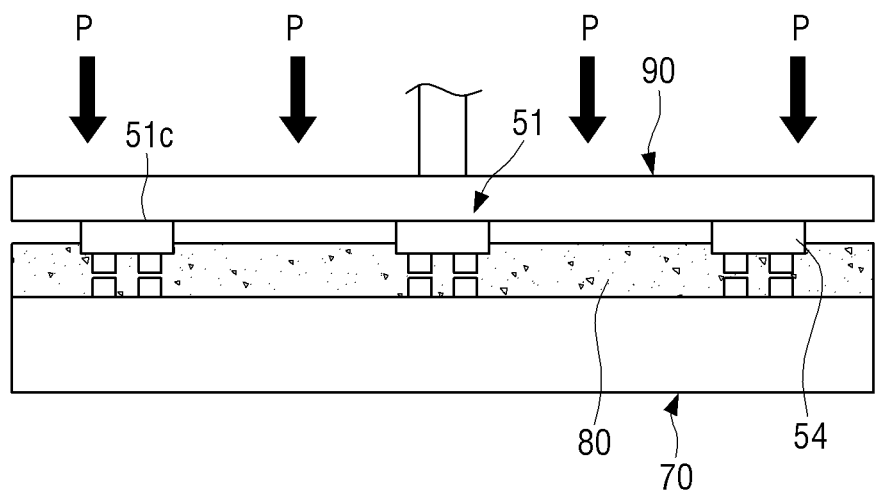
FIG. 9 is a schematic view illustrating a state in which the plurality of micro LEDs are heated and pressurized according to an embodiment.
Figure 10:
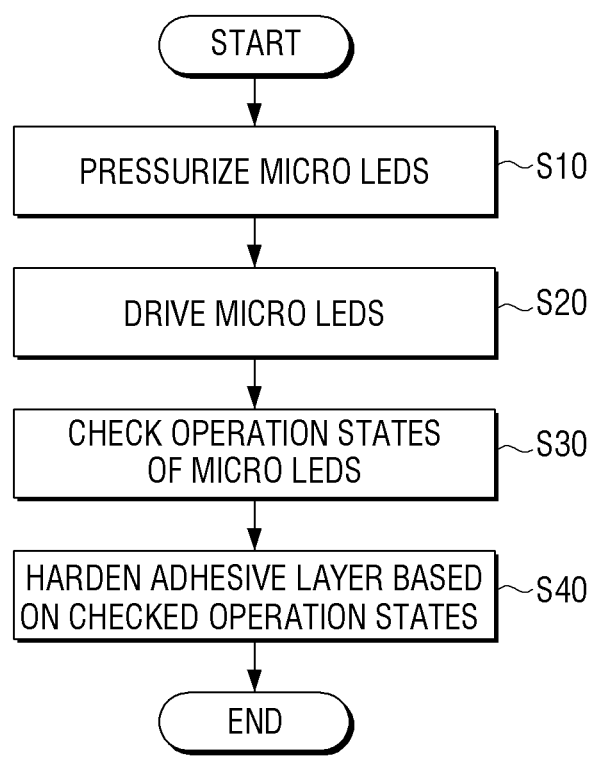
FIG. 10 is a flowchart illustrating a method of manufacturing a micro LED display module according to an embodiment.

FIG. 5 is a schematic view illustrating a state in which the adhesive layer 80 is applied onto the substrate 70 according to an embodiment. FIG. 6 is a schematic view illustrating a state in which the plurality of micro LEDs 51 are transferred in a structure of FIG. 5, according to an embodiment, FIG. 7 is a schematic view illustrating a state in which operation states of the plurality of micro LEDs 51 are checked in a structure of FIG. 6, according to an embodiment. FIG. 8 is a schematic view illustrating a state in which a defective micro LED 53 is removed from a structure of FIG. 7, according to an embodiment. FIG. 9 is a schematic view illustrating a state in which the plurality of micro LEDs 51 are heated and pressurized according to an embodiment. FIG. 10 is a flowchart illustrating the method of manufacturing the micro LED display module according to an embodiment.

First, as illustrated in FIG. 5, the adhesive layer 80 may be applied onto the substrate 70 on which the plurality of electrode pads 71 are formed. For example, the adhesive layer 80 may be applied to cover an entire upper surface 70a of the substrate 70.

According to an embodiment, a height H1 of the adhesive layer 80 may be sufficient to cover the plurality of electrode pads 71.

Next, as illustrated in FIGS. 6 and 10, the plurality of micro LEDs 51 disposed above the substrate 70 onto which the adhesive layer 80 is applied may be pressurized to electrically connect the plurality of micro LEDs 51 to the substrate 70 (S10).

According to an embodiment, the plurality of micro LEDs 51 may be pressurized by the pressurizing member 90.

According to an embodiment, the pressurizing member 90 may be a device for pressurizing the plurality of micro LEDs 51 and may have a flat pressurizing surface 90a, and the pressurizing surface 90a may come into contact with the light emitting surface 51c of each of the plurality of micro LEDs 51 to pressurize the light emitting surface 51c.

As the pressurizing member 90 pressurizes the plurality of micro LEDs 51, according to an embodiment, the plurality of connecting pads 52 of each of the plurality of micro LEDs 51 and the plurality of electrode pads 71 of the substrate 70 may be electrically connected to each other.

For example, according to an embodiment, in a case that the adhesive layer 80 includes the conductive particles C, the conductive particles C may be aligned by the pressurizing member 90, whereby the plurality of connecting pads 52 of each of the plurality of micro LEDs 51 and the plurality of electrode pads 71 of the substrate 70 may be electrically connected to each other.

Meanwhile, in a case that the adhesive layer 80 does not include the conductive particles C, according to an embodiment, the plurality of connecting pads 52 of each of the plurality of micro LEDs 51 directly comes into contact with the plurality of electrode pads 71 of the substrate 70 by the pressurizing member 90, whereby the plurality of connecting pads 52 of each of the plurality of micro LEDs 51 and the plurality of electrode pads 71 of the substrate 70 may be electrically connected to each other.

Although the pressurizing member 90 has been described as a separate member for pressurizing the plurality of micro LEDs 51, the pressurizing member 90 may refer to a pickup member, a pickup module, or the like for transferring the plurality of micro LEDs 51, according to an embodiment.

Specifically, according to an embodiment, the pressurizing member 90 may dispose the plurality of micro LEDs 51 on the substrate 70 in a state of picking up the plurality of micro LEDs 51 to be transferred to the substrate 70. That is, the pressurizing member 90 may be used as a member used in a pick-and-place method.

Therefore, according to an embodiment, the pressurizing member 90 may simultaneously perform the transferring of the plurality of micro LEDs 51 to the substrate 70 and the pressurization of the plurality of micro LEDs 51.

Next, as illustrated in FIG. 7, the plurality of micro LEDs 51 may be driven in a state in which the plurality of micro LEDs 51 are pressurized (S20). That is, driving power may be applied in a state in which the pressurizing member 90 pressurizes the plurality of micro LEDs 51.

According to an embodiment, the driving power may refer to power from an external power supply or the driver 60. That is, applying the driving power may mean that power is collectively or selectively applied to the plurality of micro LEDs 51 electrically connected to the substrate 70.

Further, according to an embodiment, an inspection member 100 may check operation states of the plurality of micro LEDs 51 (S30).

According to an embodiment, the inspection member 100 may be disposed adjacent to the substrate 70 and check operation states of the plurality of micro LEDs 51 to which the driving power is applied. For example, the inspection member 100 may be implemented by various devices, such as, a vision inspection system including a camera, and an automated optical inspection (AOI) system.

Further, according to an embodiment, in the checking of the operations state, the operation state may be identified based on whether each of the plurality of micro LEDs 51 to which the driving power is applied is turned on or off. Further, according to an embodiment, the operation state may be identified based on whether or not each of the plurality of micro LEDs 51 exhibits predetermined output performance. For example, the predetermined output performance may be determined to be exhibited based on one or more of: a detect brightness being equal to or greater than a predetermined brightness threshold, or a detect quality of color tones being equal to or greater than a predetermined quality of color tones threshold.

However, the operation state of the micro LED 51 may be checked not only based on the above-described standard, but also various specifications of the micro LED 51 according to selection performed by a user.

For example, according to an embodiment, at least one of the plurality of micro LEDs 51 may be identified as defective as illustrated in FIG. 7, and a position where the defective micro LED 53 is disposed may be identified.

Accordingly, in a case that all of the plurality of micro LEDs 51 are operated and the operation states of the micro LEDs 51 are identified as normal based on a predetermined standard, the adhesive layer 80 may be hardened as illustrated in FIG. 9 (S40).

That is, according to an embodiment, the adhesive layer 80 may be hardened based on the checked operation states of the plurality of micro LEDs 51. According to an embodiment, the adhesive layer 80 may be hardened by pressurizing (see FIG. 6).

Meanwhile, in a case that at least one of the plurality of micro LEDs 51 is detected as defective as illustrated in FIG. 8, a repairing process of replacing the defective micro LED 53 with an alternative micro LED 54 may be performed.

Specifically, in a case that at least one of the plurality of micro LEDs 51 is detected as defective, the defective micro LED 53 may be removed.

According to an embodiment, the defective micro LED 53 may refer to a micro LED identified by the inspection member 100 as being not operated in a state in which the driving power is applied. According to an embodiment, "not operated" may correspond to predetermined output performance not being exhibited (as discussed above).

Further, according to an embodiment, the removal of the defective micro LED 53 may be performed by using various methods, such as, a laser method or a pickup method.

Next, as illustrated in FIG. 9, according to an embodiment, the alternative micro LED 54 may be transferred to a position from which the defective micro LED 53 is removed.

According to an embodiment, the alternative micro LED 54 may refer to a micro LED replacing the defective micro LED 53 in a case that the defective micro LED 53 exists, or may refer to the plurality of initially transferred micro LEDs 51 in a case that the defective micro LED 53 does not exist.

Further, the alternative micro LED 54 may be referred to as a repaired micro LED 54.

Figure 12A:
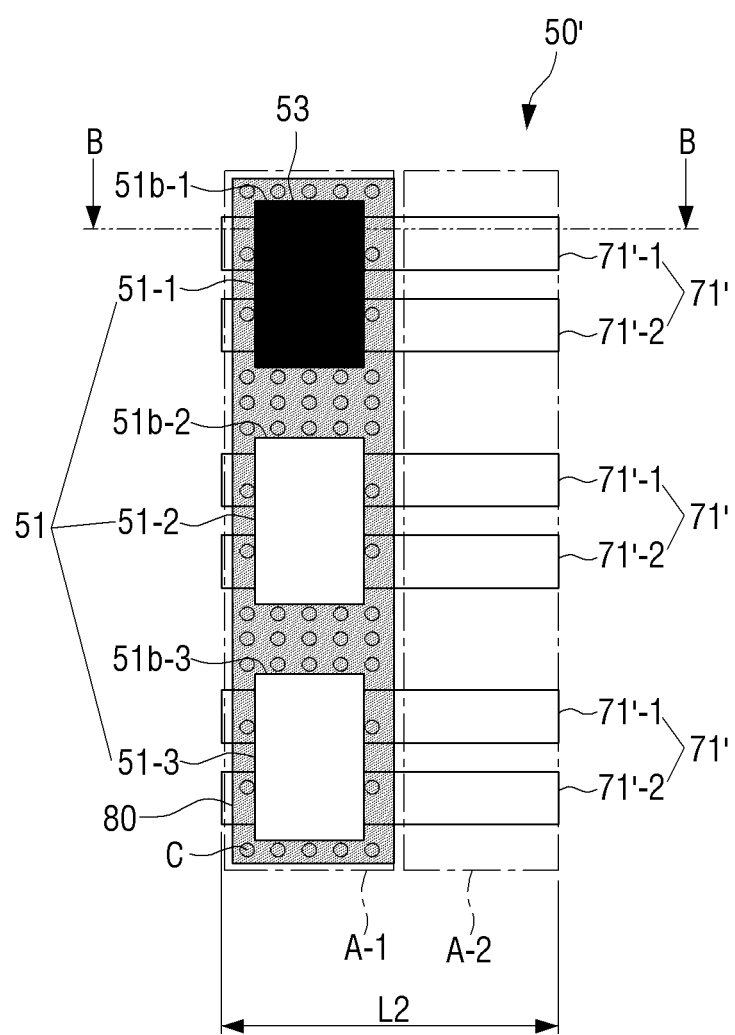
FIG. 12A is a top view illustrating a structure in which an adhesive layer is not formed in a second area in one pixel according to an embodiment.

Meanwhile, it is possible to transfer the alternative micro LED 54 to an area adjacent to the defective micro LED without removing the defective micro LED 53. To do so, it is desirable that the plurality of electrode pads 71 are formed longer as shown in FIG. 12A illustrating another embodiment that will be described later so that the alternative micro LED 54 can be electrically connected without the defective micro LED 53 being removed.

Then, as shown in FIG. 9, according to an embodiment, the adhesive layer 80 may be hardened while compressing the plurality of micro LEDs 51 and the alternative micro LED 54 disposed on the substrate 70. That is, in a case that the repairing process is performed for the defective micro LED 53, the hardening of the adhesive layer 80 (S40) may be performed after the repairing process.

According to an embodiment, the hardening of the adhesive layer 80 may be performed by heating the adhesive layer 80 at a predetermined temperature or higher with an external heat source (not illustrated), or by using ultraviolet (UV) rays.

As described above, according to an embodiment, in manufacturing one micro LED display module 20, the operation states of the plurality of micro LEDs 51 transferred to the substrate 70 may be identified (detected) before hardening the adhesive layer 80, and the defective micro LED 53 may be replaced with the alternative (repaired) micro LED 54. Therefore, an additional process of removing the hardened adhesive layer 80 and then transferring the alternative micro LED 54 may not be required.

That is, according to various embodiments of the disclosure, it is possible to greatly improve efficiency in manufacturing one micro LED display module 20.

With the above-described manufacturing process, a zero-defect micro LED display module 20 without the defective micro LED 53 may be manufactured.

Further, in the hardening of the adhesive layer 80 (S40), the adhesive layer 80 may be hardened in a state in which the plurality of micro LEDs 51 are pressurized as illustrated in FIG. 9. According to an embodiment, the adhesive layer 80 may be hardened in a state in which the electric connection between the plurality of micro LEDs 51 and the substrate 70 is maintained, and thus the plurality of micro LEDs 51 may be electrically connected to the substrate 70 in a stable manner.

Further, in the hardening of the adhesive layer 80 (S40), the adhesive layer 80 may be hardened in a state in which the driving power is applied to the plurality of micro LEDs 51, according to an embodiment. That is, the adhesive layer 80 may be hardened in a state in which all of the plurality of micro LEDs 51 are operated, according to an embodiment.

By doing so, it is possible to check a change of a state of electric connection between the plurality of micro LEDs 51 and the substrate 70 in real time during the hardening of the adhesive layer 80.

That is, it is possible to immediately check whether or not the defective micro LED 53 exists during the hardening of the adhesive layer 80.

As a result, according to an embodiment, the defective micro LED 53 may be replaced with the alternative micro LED 54 by stopping the hardening of the adhesive layer 80 before the adhesive layer 80 is completely hardened, if necessary.

Therefore, an additional process of removing the hardened adhesive layer 80 to transfer and bond the alternative micro LED 54 may not be required.

Further, after the hardening of the adhesive layer 80 illustrated in FIG. 9, the operation states of the plurality of micro LEDs 51 may be additionally checked.

For example, according to an embodiment, the operation states of all micro LEDs 51 may be checked by applying the driving power to all the micro LEDs 51 bonded to the substrate 70, including the alternative micro LED 54.

Then, the above-described process of replacing the identified defective micro LED 53 with the alternative micro LED 54 may be repeatedly performed.

By doing so, it is possible to additionally check integrity of the manufactured micro LED display module 20, thereby improving manufacturing reliability.

Meanwhile, in case that a defective micro LED is found out in the additional checking, the defective micro LED may be removed and an alternative micro LED may be transferred to a position from which the defective micro LED is removed.

Hereinafter, a structure of one pixel 50' according to an embodiment will be described in detail with reference to FIG. 11. Here, the same components will be denoted by the same reference numerals, and an overlapping description thereof will be omitted. For example, according to an embodiment, a plurality of micro LEDs 51 and an adhesive layer 80 may be the same as those described above, and thus an overlapping description thereof will be omitted. Further, according to an embodiment, a structure of a substrate 70 including a plurality of thin-film transistors 140 may be the same as that illustrated in FIG. 4B.

Figure 11:
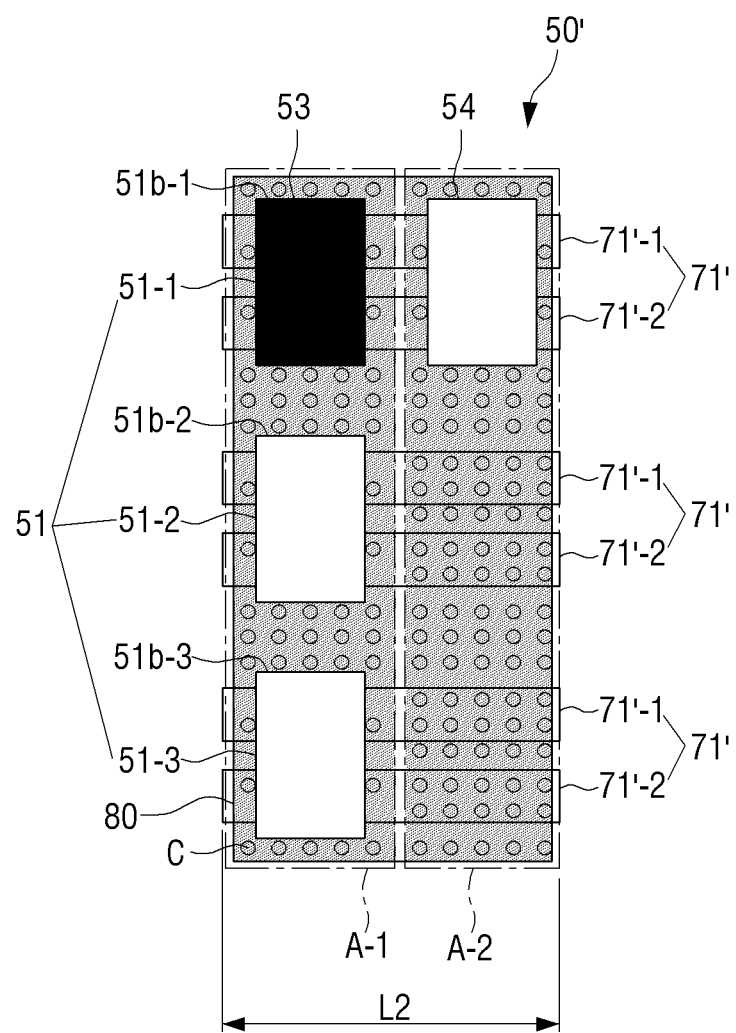
FIG. 11 is a top view illustrating one pixel according to an embodiment.

FIG. 11 is a top view illustrating one pixel 50' according to an embodiment.

According to an embodiment, the pixel 50' may have a first area A-1 in which a plurality of first micro LEDs 51 are disposed, and a second area A-2 which may be adjacent to the first area A-1 and in which an alternative micro LED 54 is disposed.

Specifically, according to an embodiment, the substrate 70 may be divided into the first area A-1 and the second area A-2, and an alternative micro LED 54 may be disposed in the second area A-2 of the substrate 70 that is adjacent to a position where a defective micro LED 53 is disposed in the first area A-1. According to an embodiment, the plurality of first micro LEDs 51 may refer to a plurality of micro LEDs bonded to a plurality of electrode pads 71' of the substrate 70 in advance.

Further, according to an embodiment, the alternative micro LED 54 disposed in the second area A-2 may refer to a micro LED disposed to replace the defective micro LED 53.

That is, according to an embodiment, the defective micro LED 53 and the alternative micro LED 54 may be arranged side by side on a pair of electrode pads 71'. Therefore, in a case that the pixel 50' is driven, the alternative micro LED 54 may be driven in place of the defective micro LED 53.

Further, according to an embodiment, a color of light to be emitted from the defective micro LED 53 may correspond to a color of light emitted from the alternative micro LED 54.

For example, according to an embodiment, in a case that the red micro LED 51-1 corresponds to the defective micro LED 53, the alternative micro LED 54 disposed to replace the red micro LED 51-1 that is the defective micro LED 53 may be a red micro LED.

Further, according to an embodiment, the length of a short side 51b-1, 51b-2, or 51b-3 of each of the plurality of micro LEDs 51 may be shorter than a length L2 of each of the plurality of electrode pads 71'. For example, according to an embodiment, a second length L2 of each of the plurality of electrode pads 71' may be more than two times longer than the length of the short side 51*b*-1, 51*b*-2, or 51*b*-3 of each of the plurality of micro LEDs 51.

As a result, according to an embodiment, at least two micro LEDs may be arranged side by side at a predetermined interval on a pair of electrode pads 71'. That is, the defective micro LED 53 and the alternative micro LED 54 may be bonded to the same plurality of electrode pads 71'.

Further, the plurality of electrode pads 71' according to an embodiment may be different from the plurality of electrode pads 71 according to the above-described embodiment only with regard to the length, and a material and a position thereof may be the same as the plurality of electrode pads 71 according to the above-described embodiment.

Hereinafter, a method of manufacturing the micro LED display module according to an embodiment will be described in detail with reference to FIGS. 12A to 17.

Figure 12B:
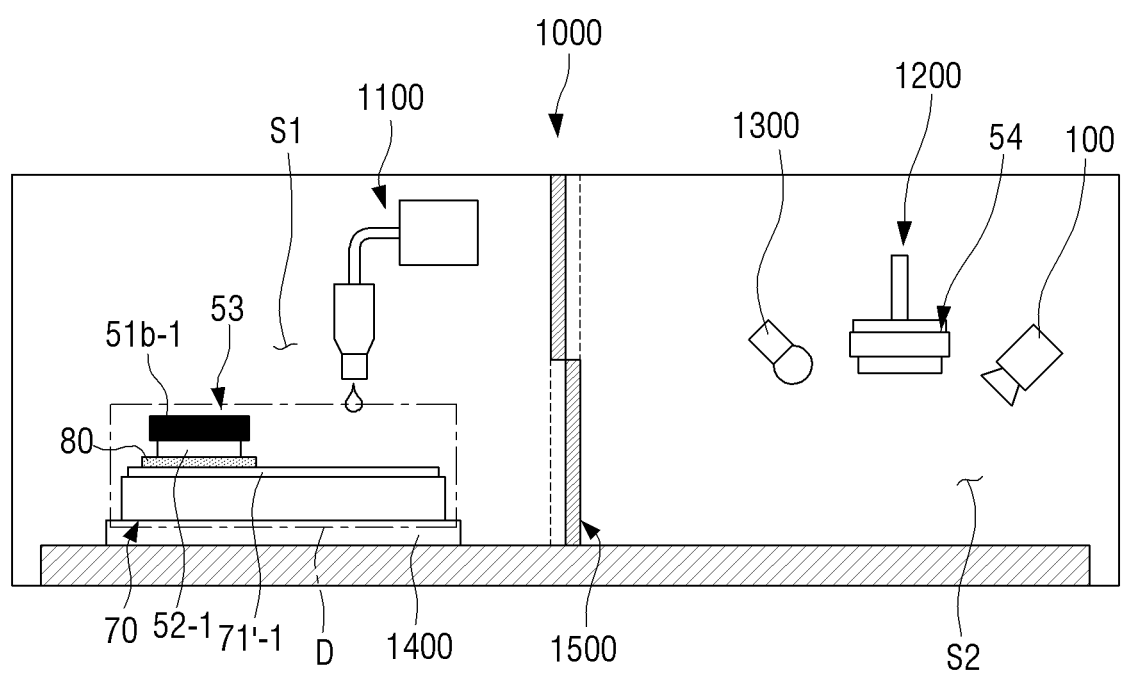
FIG. 12B is a schematic view illustrating a micro LED display module manufacturing apparatus according to an embodiment.
Figure 13A:
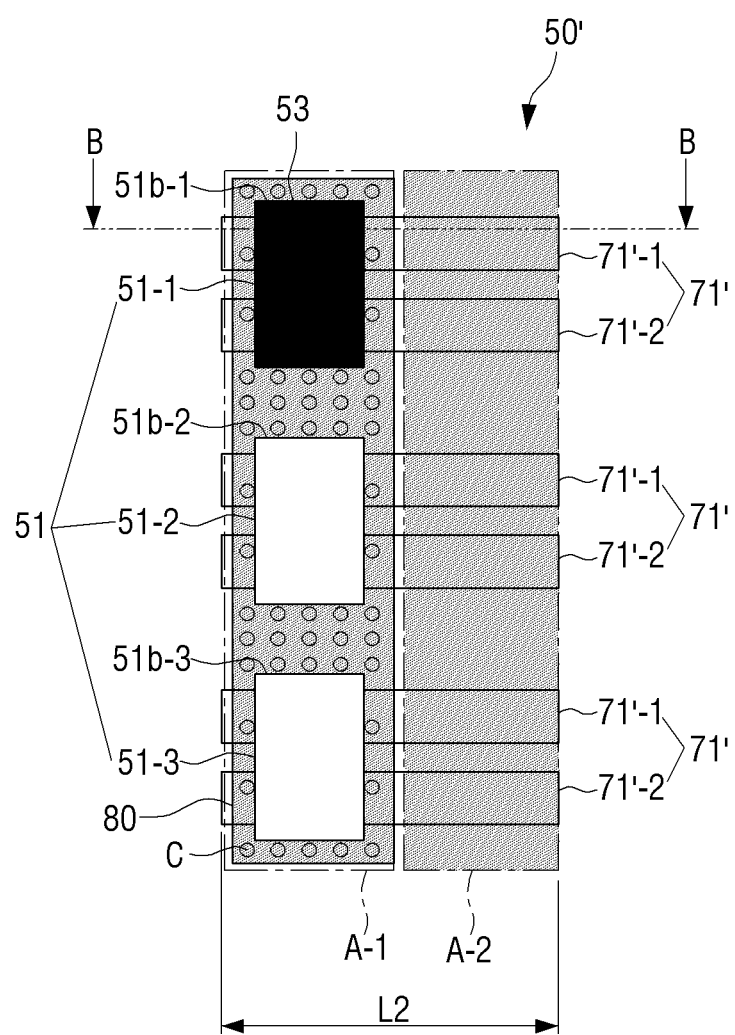
FIG. 13A is a top view illustrating a structure in which the adhesive layer is formed in the second area in a structure of FIG. 12A according to an embodiment.
Figure 13B:
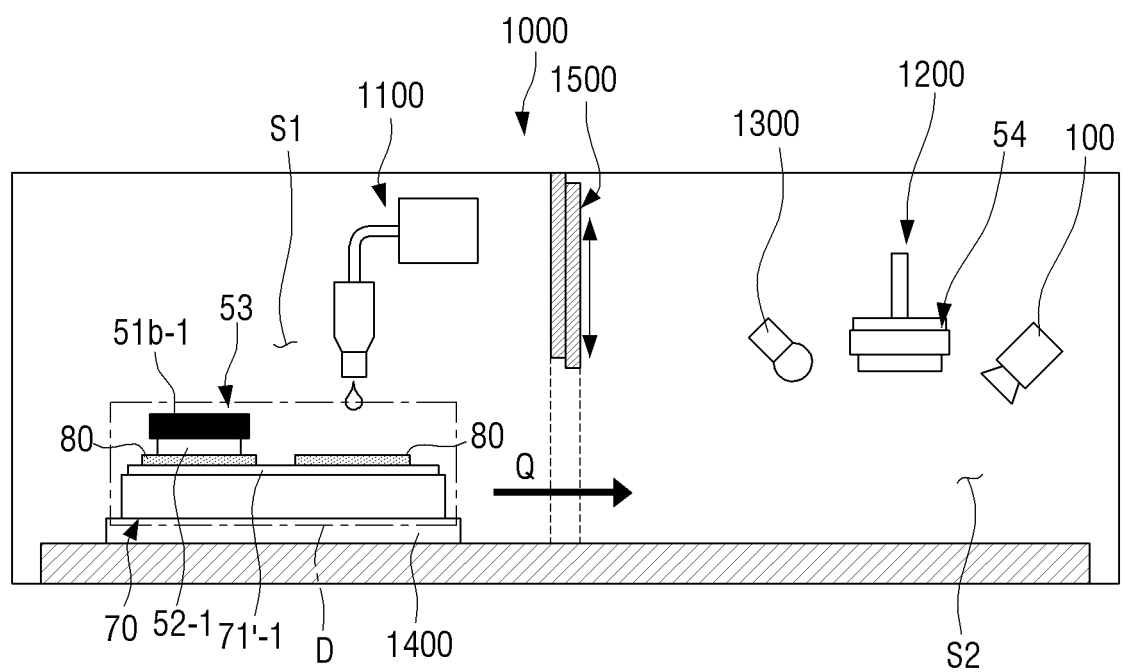
FIG. 13B is a schematic view illustrating a state in which a partition is opened in a structure of FIG. 12B according to an embodiment.
Figure 14:
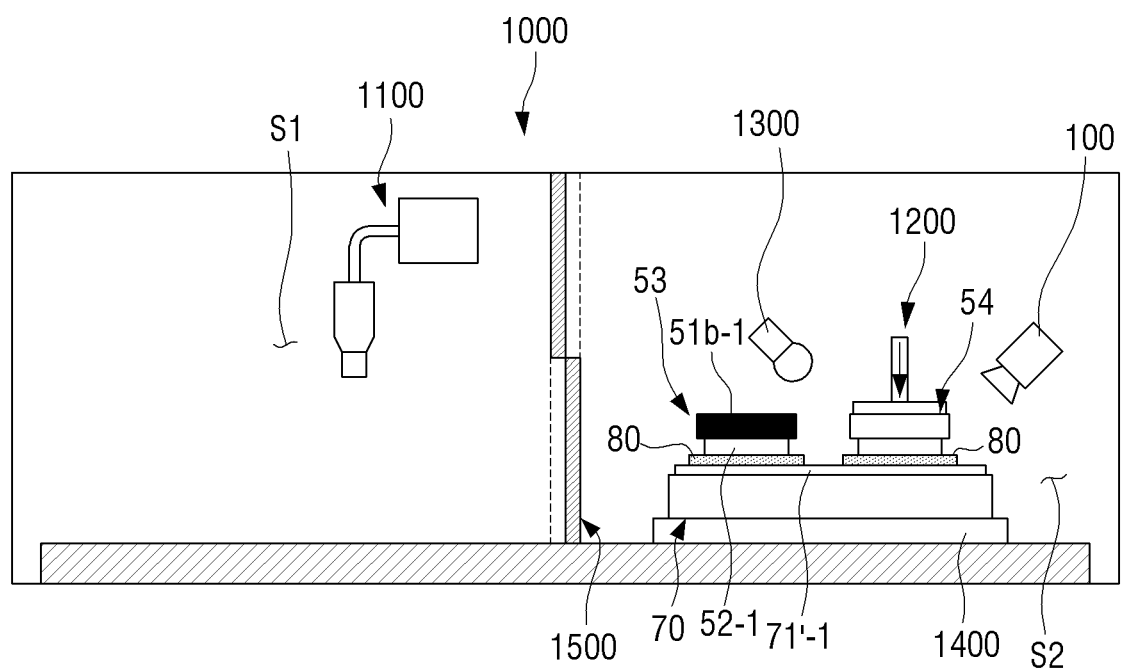
FIG. 14 is a schematic view illustrating a state in which a substrate is transported to a second space in a structure of FIG. 13B according to an embodiment.
Figure 15:
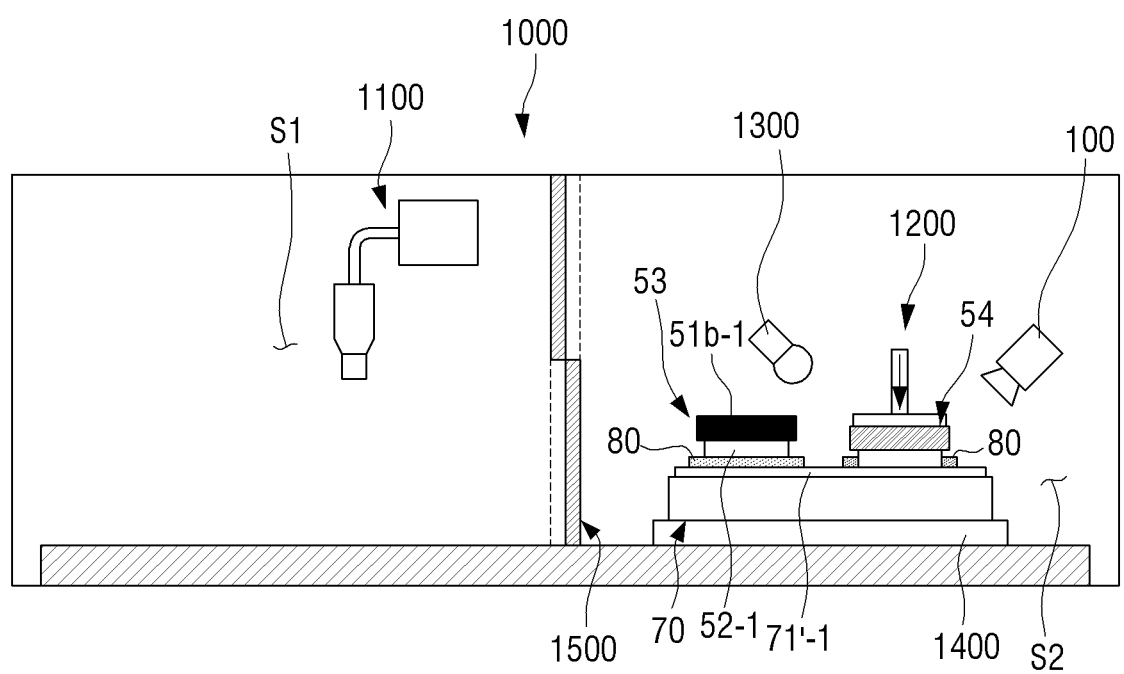
FIG. 15 is a schematic view illustrating a state in which an operation state of an alternative micro LED transferred to the substrate is checked according to an embodiment.
Figure 16:
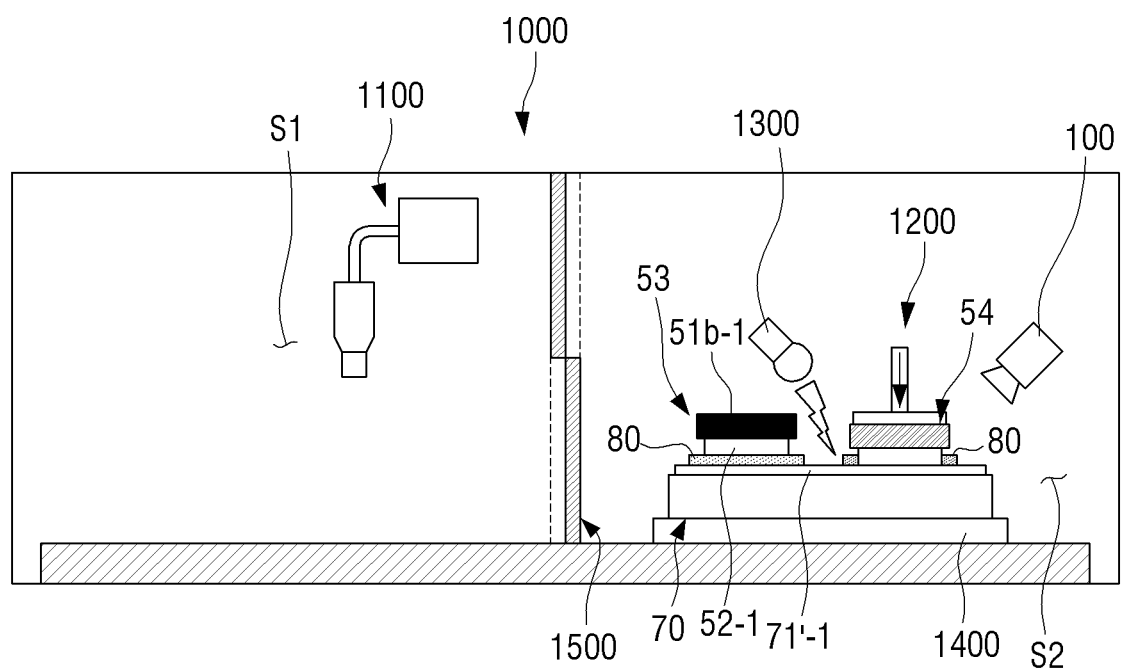
FIG. 16 is a schematic view illustrating a state in which the transferred alternative micro LED is bonded to the substrate according to an embodiment.
Figure 17:
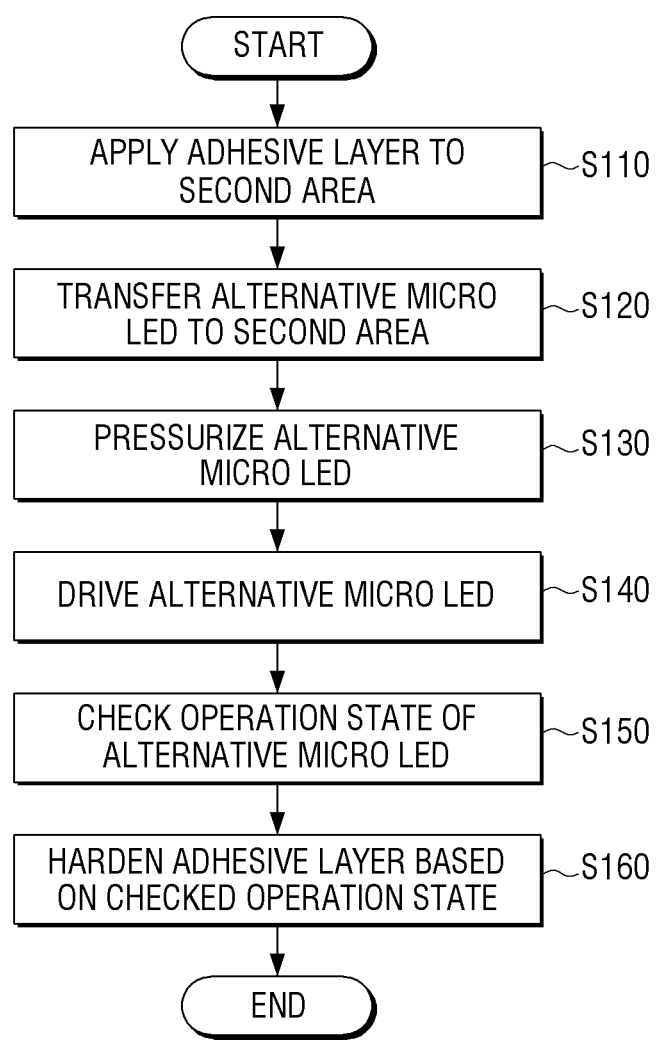
FIG. 17 is a flowchart illustrating a method of manufacturing a micro LED display module according to an embodiment.

FIG. 12A is a top view illustrating a structure in which the adhesive layer 80 is not formed in the second area A-2 in one pixel 50' according to an embodiment, FIG. 12B is a schematic view illustrating a micro LED display module manufacturing apparatus 1000 according to an embodiment, FIG. 13A is a top view illustrating a structure in which the adhesive layer 80 is formed in the second area A-2 in a structure of FIG. 12A according to an embodiment, FIG. 13B is a schematic view illustrating a state in which a partition 1500 is opened in a structure of FIG. 12B according to an embodiment, FIG. 14 is a schematic view illustrating a state in which the substrate 70 is transported to a second space S2 in a structure of FIG. 13B according to an embodiment, FIG. 15 is a schematic view illustrating a state in which an operation state of the alternative micro LED 54 transferred to the substrate 70 is checked according to an embodiment, FIG. 16 is a schematic view illustrating a state in which the transferred alternative micro LED 54 is bonded to the substrate 70 according to an embodiment, and FIG. 17 is a flowchart illustrating the method of manufacturing the micro LED display module according to an embodiment.

As illustrated in FIG. 12B, according to an embodiment, the display module manufacturing apparatus 1000 may transfer and bond a display module to the substrate 70. Further, the display module manufacturing apparatus 1000 may include an applying member 1100 that applies the adhesive layer 80, a pickup member 1200 that transfers and pressurizes the alternative micro LED 54, a hardening member 1300 that hardens the adhesive layer 80, a transporting member 1400 that transports the substrate 70 in the display module manufacturing apparatus 1000, and the partition 1500 that partitions the display module manufacturing apparatus 1000.

According to an embodiment, the applying member 1100 is positioned in a first space S1 of the display module manufacturing apparatus 1000, and may finely apply the adhesive layer 80 in the second area A-2 of the substrate 70 disposed in the first space S1.

Further, according to an embodiment, the applying member 1100 may apply the adhesive layer 80 in the second area A-2 of the pixel 50' by using one or more various fine coating methods, such as, one or more of: an inkjet printer, a spray coater, an electrohydrodynamics (EHD) jet printer, an aerosol jet printer, a screen printer, a nozzle printer, or a stencil printer.

According to an embodiment, the pickup member 1200 may be positioned in the second space S2 of the display module manufacturing apparatus 1000, and may dispose the alternative micro LED 54 in the second area A-2 of the substrate 70 disposed in the second space S2.

Specifically, according to an embodiment, the pickup member 1200 may transfer the alternative micro LED 54 to the same plurality of electrode pads 71' as the plurality of electrode pads 71' to which the defective micro LED 53 is bonded.

Further, according to an embodiment, the pickup member 1200 may transfer the alternative micro LED 54 to the substrate 70 by using the pick-and-place method. For example, the pickup member 1200 may transfer the alternative micro LED 54 to the substrate 70 by using one or more various methods, such as, one or more of: an adhesive method, a vacuum method, an electrostatic method, or a hybrid method.

Further, according to an embodiment, the pickup member 1200 may be a pressurizing member 90 and may pressurize the alternative micro LED 54 transferred to the substrate 70.

The hardening member 1300 may be positioned in the second space S2 of the display module manufacturing apparatus 1000, and may harden the adhesive layer 80 by heating the adhesive layer 80 applied onto the substrate 70 in the second space S2, according to an embodiment.

Further, the hardening member 1300 may harden the adhesive layer 80 by heating or by using ultraviolet rays, according to an embodiment.

As a result, the alternative micro LED 54 disposed on the substrate 70 may be bonded to the substrate 70, according to an embodiment.

According to an embodiment, the transporting member 1400 may transport the substrate 70 seated on the transporting member 1400 to the first space S1 and the second space S2. For example, according to an embodiment, the transporting member 1400 may transport the substrate 70 seated on the transporting member 1400 from the first space S1 to the second space S2, and from the second space S2 to the first space S1.

However, movement of the transporting member 1400 is not limited to the movement between the first space S1 and the second space S2, and the transporting member 1400 may serve as a part of a conveyer of the display module manufacturing apparatus 1000 and discharge the substrate 70 to the outside of the display module manufacturing apparatus 1000 for various additional processes.

According to an embodiment, the partition 1500 may partition an inner space of the display module manufacturing apparatus 1000. For example, according to an embodiment, the partition 1500 may be disposed between the first space S1 in which the applying member 1100 is disposed, and the second space S2 in which the inspection member 100, the pickup member 1200, and the hardening member 1300 are disposed, for partitioning into the first space S1 and the second space S2.

Therefore, it is possible to prevent residues of the adhesive layer 80 from moving to the second space S2 through the air in case that the applying member 1100 forms the adhesive layer 80 on the substrate 70.

Further, it is possible to prevent residual heat or UV from being transferred to the first space S1 in a case that the hardening member 1300 hardens the adhesive layer 80 applied onto the substrate 70 through heating or UV curing.

According to an embodiment, the partition 1500 may be selectively opened to spatially connect the first space S1 and the second space S2, or may be closed for partitioning between the first space S1 and the second space S2.

Referring to FIGS. 12A and 12B, according to an embodiment, the substrate 70 seated on the transporting member 1400 is in a state in which the adhesive layer 80 is not applied to the second area A-2, and the plurality of first micro LEDs 51 disposed in the first area A-1 is in a state of including the defective micro LED 53.

In addition, according to an embodiment, the adhesive layer 80 disposed in the first area A-1 may be in a hardened state.

According to an embodiment, a region D illustrated in FIG. 12B corresponds to the cross-sectional view taken along line B-B of FIG. 12A.

First, the applying member 1100 may apply the adhesive layer 80 in the second area A-2 of the substrate 70 disposed in the first space S1 (S110). That is, according to an embodiment, the adhesive layer 80 may be applied to the second area A-2 of the substrate 70 that is adjacent to the position where the defective micro LED 53 of the plurality of micro LEDs 51 bonded to the first area A-1 of the substrate 70 is disposed.

Next, as illustrated in FIGS. 13A and 13B, the substrate 70 that is in a state in which the adhesive layer 80 is applied to the second area A-2 may be moved from the first space S1 to the second space S2 along a Q direction by the transporting member 1400, according to an embodiment.

That is, according to an embodiment, after applying the adhesive layer 80, the substrate 70 to which the adhesive layer 80 is applied may be transported from the first space S1 in which the adhesive layer 80 is applied to the second space S2 that is different from the first space S1.

According to an embodiment, the partition 1500 may be opened to spatially connect the first space S1 and the second space S2. Specifically, according to an embodiment, the partition 1500 for partitioning into the first space S1 and the second space S2 may be opened before transporting the substrate 70 to the second space S2, and the partition 1500 may be closed after transporting the substrate 70 to the second space S2.

That is, according to an embodiment, the partition 1500 may be selectively opened or closed depending on the movement of the substrate 70.

Then, as illustrated in FIG. 14, according to an embodiment, the alternative micro LED 54 may be transferred to the substrate 70 moved to the second space S2 by the transporting member 1400. That is, the alternative micro LED 54 may be transferred to the second area A-2 to which the adhesive layer 80 is applied (S120).

According to an embodiment, the alternative micro LED 54 may be transferred by using the pick-and-place method.

According to an embodiment, before transferring the alternative micro LED 54 to the substrate 70, the pickup member 1200 may arrange the alternative micro LED 54 in a form in which the plurality of electrode pads 71' formed on an upper surface 70a of the substrate 70 face a plurality of connecting pads 52 formed on one surface of the alternative micro LED 54, respectively.

Accordingly, according to an embodiment, in a case that the alternative micro LED 54 is transferred to the second area A-2, the plurality of connecting pads 52 of the alternative micro LED 54 may be disposed to face the plurality of electrode pads 71', respectively.

Next, as illustrated in FIG. 15, according to an embodiment, the pickup member 1200 may pressurize the alternative micro LED 54 to electrically connect the alternative micro LED 54 to the substrate 70 (S130).

According to an embodiment, although the case that the pickup member 1200 pressurizes the alternative micro LED 54 has been illustrated, a separate pressurizing member 90 may pressurize the alternative micro LED 54, if necessary.

For example, according to an embodiment, a pressure of 0.1 to 10 gf/cm$^2$ may be applied to the alternative micro LED 54.

Next, according to an embodiment, the alternative micro LED 54 may be driven in a state in which the alternative micro LED 54 is pressurized (S140). Then, according to an embodiment, the inspection member 100 may check an operation state of the alternative micro LED 54 (S150).

According to an embodiment, the operation state may refer to a turned-on/off state of the alternative micro LED 54 to which the driving power is applied.

For example, according to an embodiment, in a case that the alternative micro LED 54 is in a turned-on state, the alternative micro LED 54 may be identified as being operated, and the adhesive layer 80 applied to the second area A-2 may be hardened (S160) based on the alternative micro LED being identified as being operated. That is, according to an embodiment, the adhesive layer 80 may be hardened based on the checked operation state.

Further, although the case that the operation state is identified based on the turned-on/off state of the alternative micro LED 54 has been described above, the operation state may also be identified based on whether or not the alternative micro LED 54 exhibits predetermined output performance such as a predetermined brightness or higher and a predetermined quality of color tones or higher.

Further, according to an embodiment, as illustrated in FIG. 16, the hardening member 1300 may harden the adhesive layer 80 applied to the second area A-2 in a state in which the alternative micro LED 54 is driven.

By doing so, it is possible to check the operation state of the alternative micro LED 54 in real time during the hardening of the adhesive layer 80, thereby determining whether or not to completely harden the adhesive layer 80.

Further, according to an embodiment, in the hardening of the adhesive layer 80, the hardening member 1300 may harden the adhesive layer 80 in a state in which the alternative micro LED 54 is continuously pressurized.

By doing so, it is possible to prevent the alternative micro LED 54 and the substrate 70 from being electrically disconnected from each other during the hardening of the adhesive layer 80, and to harden the adhesive layer 80 in a state in which the alternative micro LED 54 is stably fixed.

Meanwhile, according to an embodiment, in a case that the alternative micro LED 54 is in a turned-off state, the alternative micro LED 54 may be identified as being defective, and an additional repairing process may be performed.

For example, according to an embodiment, in a case that the alternative micro LED 54 is defective, the defective alternative micro LED may be removed. Then, according to an embodiment, an additional alternative micro LED may be transferred to a position from which the defective alternative micro LED is removed.

According to an embodiment, the removal of the defective alternative micro LED 54 may be performed by using one or more various methods, such as, a laser method or a pickup method.

Further, according to an embodiment, the additional alternative micro LED may be transferred by the same method as the transfer method of the alternative micro LED 54 described above.

For example, according to an embodiment, in a case that the alternative micro LED is defective, the additional alternative micro LED may be transferred by the pickup member 1200 in the second space S2 in a state in which the defective alternative micro LED 54 is removed.

Then, according to an embodiment, similarly to the transfer method of the alternative micro LED 54 described above, an operation state of the additional alternative micro LED may be checked by pressurizing and driving the additional alternative micro LED, and the adhesive layer 80 may be hardened.

Further, according to an embodiment, the operation state of the additional alternative micro LED may be checked by pressurizing and driving the additional alternative micro LED, and the above-described repairing process may be repeatedly performed based on the checked operation state.

By doing so, it is possible to check the operation state of the alternative micro LED 54 simultaneously with the transferring of the alternative micro LED 54 before hardening the adhesive layer 80 applied to the second area A-2 through the method of manufacturing the micro LED display module according to another embodiment of the disclosure described above.

Therefore, according to an embodiment, an additional process of removing the adhesive layer 80 hardened in the second area A-2 to transfer and bond the alternative micro LED 54 may not be required.

Further, according to an embodiment, all the processes for transferring the alternative micro LED 54 may be performed in one micro LED display module manufacturing apparatus 1000, and thus it is possible to reduce contamination, damage, and time consumption caused by exposure of the substrate 70 to the outside and movement of the substrate 70. That is, it is possible to greatly improve efficiency in manufacturing the micro LED display module 20.

Although the various embodiments of the disclosure have been individually described hereinabove, the respective embodiments are not necessarily implemented singly, but may also be implemented so that configurations and operations thereof are combined with those of one or more other embodiments.

Although embodiments of the disclosure have been illustrated and described hereinabove, the disclosure is not limited to the abovementioned specific embodiments, but may be variously modified by those skilled in the art to which the disclosure pertains without departing from the gist of the disclosure as disclosed in the accompanying claims. These modifications should also be understood to fall within the scope and spirit of the disclosure.

What is claimed is:

1. A micro light emitting diode (LED) display module comprising:

a plurality of micro LEDs each having one surface on which a plurality of connecting pads are formed; and a substrate in which a plurality of thin-film transistors are formed and on which the plurality of micro LEDs are disposed and a plurality of electrode pads connected to each of the plurality of thin-film transistors are formed, wherein the plurality of connecting pads are electrically connected to the plurality of electrode pads, respectively, and a length of each of the plurality of electrode pads is more than two times longer than a length of a short side of each of the plurality of micro LEDs, and wherein the substrate is divided into a first area and a second area, an alternative micro LED is disposed in the second area of the substrate that is adjacent to a position where a defective micro LED is disposed in the first area, and the defective micro LED and the alternative micro LED are bonded to the plurality of electrode pads.

2. The micro LED display module as claimed in claim 1, wherein the plurality of micro LEDs include a red micro LED which emits red light, a green micro LED which emits green light, and a clue micro LED which emits blue light, and the red micro LED, the green micro LED, and the blue micro LED are sequentially arranged on the substrate.

* * * * *